US006838015B2

(12) United States Patent
Cotte et al.

(10) Patent No.: US 6,838,015 B2
(45) Date of Patent: Jan. 4, 2005

(54) LIQUID OR SUPERCRITICAL CARBON DIOXIDE COMPOSITION

(75) Inventors: John Michael Cotte, New Fairfield, CT (US); Dario L. Goldfarb, Mohegan Lake, NY (US); Pamela Jones, Bronx, NY (US); Kenneth John McCullough, Fishkill, NY (US); Wayne Martin Moreau, Wappinger, NY (US); Keith R. Pope, Danbury, CT (US); John P. Simons, Wappingers Falls, NY (US); Charles J. Taft, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 09/945,596

(22) Filed: Sep. 4, 2001

(65) Prior Publication Data

US 2003/0045117 A1 Mar. 6, 2003

(51) Int. Cl.[7] .................. C09K 13/00; C09K 13/04; C09K 13/06; H01L 21/302; H01L 21/3065
(52) U.S. Cl. .................. 252/79.1; 252/79.2; 252/79.4; 438/689; 438/745; 216/57
(58) Field of Search ............... 252/79.1, 79.2, 252/79.4, 79.3; 438/689, 745, 706; 216/57

(56) References Cited

U.S. PATENT DOCUMENTS

| 4,944,837 | A | * | 7/1990 | Nishikawa et al. ......... 156/646 |
|---|---|---|---|---|
| 5,185,296 | A | | 2/1993 | Morita et al. ............... 438/694 |
| 5,304,515 | A | | 4/1994 | Morita et al. ............... 438/781 |
| 5,401,322 | A | * | 3/1995 | Marshall ...................... 134/13 |
| 5,643,474 | A | * | 7/1997 | Sangeeta ..................... 216/96 |
| 5,783,082 | A | | 7/1998 | DeSimone et al. ......... 210/634 |
| 5,868,862 | A | * | 2/1999 | Douglas et al. .............. 134/26 |
| 5,904,487 | A | * | 5/1999 | Conboy et al. .............. 438/14 |
| 5,908,510 | A | | 6/1999 | McCullough et al. ......... 134/2 |
| 5,925,501 | A | | 7/1999 | Zhang et al. ............... 430/313 |
| 5,976,264 | A | | 11/1999 | McCullough et al. ......... 134/2 |
| 5,980,770 | A | | 11/1999 | Ramachandran et al. ..... 216/67 |
| 5,981,454 | A | | 11/1999 | Small ......................... 510/175 |
| 6,113,708 | A | * | 9/2000 | Hopple et al. ................ 134/7 |
| 6,149,828 | A | * | 11/2000 | Vaartstra ..................... 216/57 |
| 6,565,764 | B2 | * | 5/2003 | Hiraoka et al. .............. 216/56 |

OTHER PUBLICATIONS

Ziger et al., AIchE Journal, 33, No. 10, (10/87).

* cited by examiner

*Primary Examiner*—Nadine G. Norton
*Assistant Examiner*—Lynette T. Umez-Eronini
(74) *Attorney, Agent, or Firm*—Scully, Scott, Murpy & Presser; Daniel P. Morris, Esq.

(57) ABSTRACT

A composition which includes liquid or supercritical carbon dioxide and an acid having a pKa of less than about 4. The composition is employed in a process of removing residue from a precision surface, such as a semiconductor sample, in which the precision surface is contacted with the composition under thermodynamic conditions consistent with the retention of the liquid or supercritical carbon dioxide in the liquid or supercritical state.

8 Claims, 1 Drawing Sheet

LIQUID OR SUPERCRITICAL CARBON DIOXIDE COMPOSITION

DETAILED DESCRIPTION

1. Field of the Invention

The present invention relates to a liquid or supercritical carbon dioxide composition and to a process of removing residue material from a precision surface, e.g. a semiconductor sample, which has been first subjected to an etching process by contacting that surface with the carbon dioxide composition. More specifically, the present invention is directed to a liquid or a supercritical carbon dioxide composition which includes an acid having a pKa of less than about 4 and to a process of removing residue formed in an etching process on a precision surface, such as a semiconductor sample, which comprises exposing the precision surface to that composition.

2. Background of the Prior Art

In the field of advanced semiconductor manufacturing, it is well known to expose a semiconductor sample, such as a semiconductor wafer containing blanket metal or insulating films and a photoresist exposed with patterns, to an etching process using a mixture of gases containing, but not limited, to chlorine and/or fluorine. The purpose of such an etching process is to define patterns in the film. The photoresist is then typically stripped in an oxygen plasma. The residue remaining from that etching often needs to be removed by chemicals and/or solvents in order to achieve high yield.

For example, Al or Cu metal etching is commonly used to define wiring on semiconductor wafers. Despite cleaning and rinsing the semiconductor wafer, unwanted residue still remains on the top and the sidewalls of the metal lines. This unwanted residue, which remains on the top and sidewalls of the metal lines, reportedly includes the elements carbon, hydrogen, silicon, aluminum, fluorine, chlorine and oxygen. Such residue, which is referred to herein as reaction ion etching (RIE) residue, is known to be conductive enough to cause shorts between metal lines. Moreover, the RIE residue may also cause adhesion problems between the metal lines and the overlying insulator. The RIE residue on metal lines may cause corrosion of the semiconductor sample. The RIE residue on polysilicon lines or oxide vias also causes yield loss problems. Thus, there is considerable interest in the field of advanced semiconductor manufacturing for developing a chemically safe and easy method for removing RIE residue from a semiconductor sample.

The current method which is typically being used for removal of this unwanted RIE residue in advanced semiconductor manufacturing processes involves soaking the etched semiconductor sample in an acid bath. This process employs environmentally undesirable materials. To overcome this environmentally undesirable process, methods have been devised which employ liquid or supercritical $CO_2$ as a solvent for removing the residue from a precision surface which has been first subjected to an etching process.

It is emphasized that supercritical fluids, such as supercritical $CO_2$, are currently used in semiconductor processing for developing a resist pattern layer on a substrate. Such a process is disclosed, for example, in U.S. Pat. No. 4,944,837 to Nishikawa et al. Specifically, Nishikawa et al. provides a method of forming a patterned resist film having a predetermined pattern on a surface layer formed on a substrate comprising the steps of depositing a resist film on the surface layer, pre-processing the resist film into a pre-processed resist film which is attached to the surface layer and which has a latent image of the predetermined pattern and processing the pre-processed resist film into the patterned resist film. In accordance with the disclosure of Nishikawa et al., the processing step comprises introducing the pre-processed resist film together with the substrate into a supercritical atmosphere and developing the pre-processed film in a supercritical atmosphere to selectively remove the pre-processed film.

Other examples of using supercritical fluids in semiconductor manufacturing are disclosed in U.S. Pat. Nos. 5,185,296 and 5,304,515, both to Morita et al. In both of these disclosures, supercritical fluids are used for forming a dielectric thin film or pattern thereof on the surface of a semiconductor substrate. As in the above reference to Nishikawa et al., the supercritical fluids are used in both of the Morita et al. references to develop the pattern resist film on the surface of the semiconductor substrate.

In an article by Ziger et al. entitled "Compressed Fluid Technology: Application to RIE-Developed Resists", AICHE Journal, Vol. 33, No. 10, October 1978, compressed $CO_2$, i.e. supercritical fluid $CO_2$, is utilized in the area of microlithography to extract nonvolatile siloxane molecules from a host organic polymer.

U.S. Pat. No. 5,976,264 to McCullough et al. represents a significant advance in the art insofar as it addresses the removal of residue from a precision surface which has been first subjected to an etching process. In that method liquid or supercritical carbon dioxide is used in conjunction with a surfactant. Although the method of this disclosure removes residue from a precision surface, the use of a supercritical fluid and a surfactant is only partially effective in cases where residue is disposed in deep trenches, i.e. 100 to 1,000 nanometers (nm) wide and 100 to 5,000 nm deep, where the residue is polymeric and of the post $CF_4$-type.

Post polymeric $CF_4$-type residue is a complex structure having C—F and C=O bonds that is dissimilar to the bonds present in polytetraflurorethylene. Those skilled in the art are aware of the solubility of polytetraflurorethylene in heated liquid carbon dioxide. Unfortunately, polymeric residue resulting from fluorocarbon reaction ion etching is of the post $CF_4$-type and is not removed by compositions containing only liquid or supercritical carbon dioxide and surfactant. It is theorized that the strong adhesive bond between the polymeric residue and the precision surface needs chemical attack to break that bond so that the residue may be removed.

In view of the fact that polymeric post $CF_4$-type residue cannot be removed by other methods of residue removal as taught in U.S. Pat. Nos. 5,738,082; 5,925,501; 5,980,770; and 5,981,454, it is apparent that there is a strong need in the art for a new method of residue removal following microelectric processing.

BRIEF SUMMARY OF THE INVENTION

A new composition has now been developed which is effectively employed in a new process for removal of post $CF_4$-type polymeric residue from precision surfaces. In accordance with the present invention a new composition has been developed which includes liquid or supercritical carbon dioxide and an acid having a pKa of less than about 4. The present invention also encompasses a process of removing residues from precision surfaces by applying thereto a residue removal effective amount of the composition of the present invention.

BRIEF DESCRIPTION OF THE DRAWINGS

The present invention may be better understood by reference to the drawing which is a schematic diagram of an apparatus employed in the instant invention for the removal of residue from a precision surface such as a semiconductor sample.

DETAILED DESCRIPTION

Figure 1:
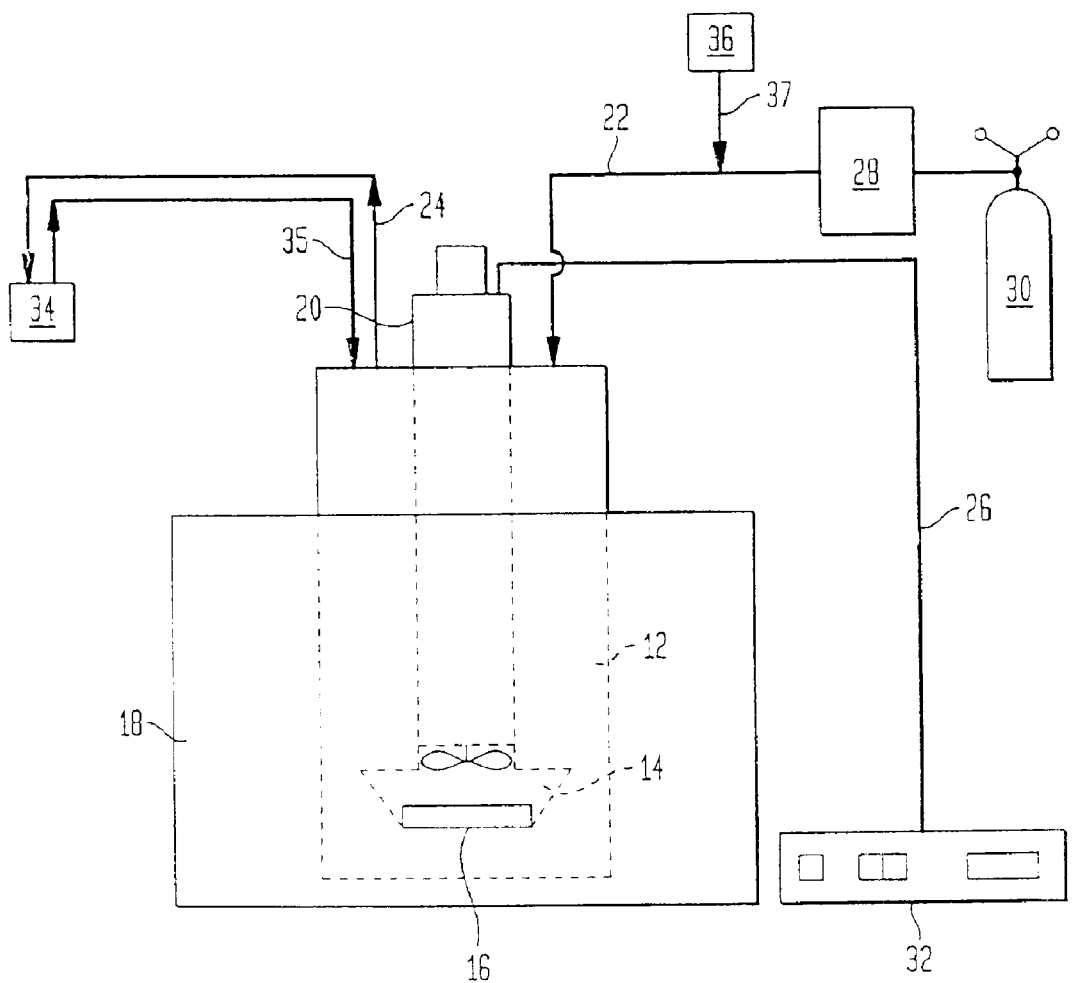

The composition of the present invention includes liquid or supercritical carbon dioxide and an acid having a pKa of less than about 4. The acid is preferably also partially soluble in the liquid or supercritical carbon dioxide. Thus, in a preferred embodiment, the acid is at least about 1% by weight soluble in liquid or supercritical carbon dioxide.

Liquid carbon dioxide be present under specified thermodynamic conditions. Specifically, in order for carbon dioxide to be in the liquid state at non-cryogenic temperatures the pressure of the carbon dioxide needs to be sufficiently high. Supercritical carbon dioxide requires that the temperature and pressure of the carbon dioxide be at or above the critical temperature and critical pressure of carbon dioxide.

Acids useful in the composition of the present invention are those acids whose pKa are less than about 4. Examples of such acids include formic acid, hydrogen fluoride and a perhaloacid selected from the group consisting of acids of the general formula $CX_3(CX_2)_n(COOH)$ and acids of the general formula $CX_3(CX_2)_nSO_3H$, where X is F, Cl, H or mixtures thereof with the proviso that the perhaloacid includes at least one atom of fluorine or chlorine; and n is 0, 1 or 2. These exemplified acids all meet the requirement that their pKa is less than about 4 and meet the further preferred characteristic that the acid be soluble, to the extent of at least about 1% by weight, in liquid or supercritical carbon dioxide.

Specific acids within the contemplation of the present invention include trichloroacetic acid, trichlorosulfonic acid, dichloroacetic acid, chloroacetic acid, hydrogen fluoride and formic acid.

Preferably, the composition of the present invention includes liquid or supercritical carbon dioxide and an acid having a pKa of less than about 4 such that the liquid or supercritical carbon dioxide comprises at least about 85% by weight, based on the total weight of the carbon dioxide and the acid. Most preferably, the composition comprises between about 90% and about 99.9% liquid or supercritical carbon dioxide. Most preferably, the composition includes between about 95% and about 99.9% liquid or supercritical carbon dioxide. These percentages are by weight, based on the total weight of the $CO_2$-acid composition.

In a preferred embodiment the composition includes a third component, a co-solvent. Among preferred co-solvents are acetic acid, methanol, isopropanol, and butylene carabonate. In the preferred embodiment wherein the composition includes a co-solvent, that co-solvent is preferably present in a concentration of about 1% to about 20% by weight, based on the total weight of the composition. More preferably, compositions within the contemplation of the present invention which include a co-solvent include between about 1% by weight and about 10% by weight co-solvent, based on the total weight of the liquid or supercritical carbon dioxide composition.

The composition of the present invention is uniquely employed in the process of the present invention. That process is the removal of polymeric residues from a precision surface which has been subject to etching. Non-exclusive examples of such etching processes include reaction ion etching (RIE), ion beam etching (IBE), plasma etching and laser ablation. Of these, RIE is most commonly utilized and is the etching process which results in residues on a precision surface most suitably removed by the process of the present invention. It is particularly preferred that the residue removal process be applied to fluorocarbon RIE.

The term "precision surface" as used herein denotes a material which has controlled features below the plane of the surface, such as cavities, trenches or channels incorporated into the material or controlled features raised above the plane of the surface, such as mesas. Precision surfaces include, but are not limited to, semiconductor samples, metals, polymers and insulators.

The material of construction of precision surfaces within the contemplation of the present application includes metals such as aluminum, silicon, tungsten, titanium, tantalum, platinum, palladium, iridium, chromium, copper and gold. In addition, the precision surface material of construction may be a polymer such as polyimides and polyamides.

Of the precision surfaces utilizable in the process of the present invention, semiconductor samples are particularly preferred. Of these semiconductor samples, semiconductor wafers are particularly suited to residue removal employing the process of the present application.

It should be noted that the description provided hereinbelow while being specific to RIE semiconductor samples is also valid for other types of precision surfaces which may be etched by any of the aforementioned etching techniques. For example, the description provided hereinbelow also applies to an IBE insulator, a laser ablated polymer and the like.

Operation of the process of the present invention will be better understood by reference to the drawing which is a schematic diagram of an apparatus 10 that can be used in the present invention for removing RIE residue from a semiconductor sample containing the same. Apparatus 10 includes process chamber 12 having a sample zone 14 wherein the semiconductor sample 16 is placed. The process chamber 12 is surrounded by heater jacket 18 and contains, optionally, a stirring mechanism 20. Additionally, the process chamber contains inlet line 22, outduct 24 and thermocouple 26. The inlet line 22 contains a high pressure pump system 28 which is connected to gas cylinder 30 for supplying liquid or supercritical carbon dioxide thereof to process chamber 12. Thermocouple 26 is also connected to heater control 32 which is utilized for controlling and monitoring the temperature of the RIE residue removal process. Apparatus 10 may also include reservoir 34 for collecting and/or purifying supercritical fluids that exit process chamber 12 through outduct 24. This material may then be recycled into the process chamber via duct 35. Gas cylinder 30 contains a pressurized carbon dioxide.

As shown in the drawing, the liquid or supercritical carbon dioxide may be pre-pressurized with a high pressure pump. Typically, in the present invention, the liquid or supercritical carbon dioxide is pre-pressurized to a pressure of about 1000 psi to 6000 psi. More preferably, the liquid or supercritical carbon dioxide is pre-pressurized to a pressure of about 3000 psi before entering the processing chamber. The pre-pressurized liquid or supercritical carbon dioxide is then transferred to the processing chamber 12, which contains a semiconductor sample 16, through inlet line 22.

The semiconductor samples that can be employed in the present invention are any semiconductor samples that are processed by RIE or any of the other etching techniques mentioned hereinabove. Illustrated examples of suitable semiconductor samples that may be used in the present invention include, but are not limited to, previously mentioned semiconductor wafers as well as semiconductor chips, ceramic substrates, patterned film structures and the like.

The semiconductor sample, which may be subjected to the process of the present invention, may include one or more of the following materials: titanium silicides, tantalum nitride, tantalum silicide, silicon, polysilicon, silicon nitride, $SiO_2$, diamond-like carbon, polyimides, polyamides, aluminum, aluminum with copper, copper, tungsten, titanium, palladium, platinum, iridium, chromium, ferroelectric materials and high dielectric materials such as BaSrTi or PbLaTi oxides.

The semiconductor sample containing residue produced by etching is placed in sample zone 14 of process chamber 12 wherein the sample is exposed to liquid or supercritical carbon dioxide under thermodynamic conditions which permit removal of residue from the sample while maintaining the carbon dioxide in its liquid or supercritical state.

Typically, in the process of the present invention, the pressure within the process chamber during residue removal is from about 1000 psi to about 6000 psi. More preferably, the pressure within the process chamber during residue removal is about 3000 psi. The temperature within the processing chamber during the residue removal, which is monitored by thermocouple 26 and controlled by controller 32, is generally from about 40° C. to about 100° C. More preferably, the temperature within the process chamber during residue removal is in the range of between about 40° C. and about 60° C.

To ensure effective removal of the residue from the semiconductor sample, the semiconductor sample should be exposed to liquid or supercritical carbon dioxide under the above conditions for about 30 minutes to about 2 hours. More preferably, the time period for exposure of the semiconductor sample to the supercritical fluid under the above-identified conditions is about 1 hr.

The supercritical fluid exiting the process chamber through outduct 24 may be cleaned, as described above, and recycled back into the apparatus so as to form a closed reactor system. Such a closed reactor system, which is not shown in FIG. 1, would greatly reduce the processing cost in producing clean semiconductor samples at the expense, of course, of greater capitol cost in its construction.

When stirring is employed within the processing chamber, the speed of the stirring unit may vary from about 500 rpm. to about 2500 rpm., preferably about 1000 rpm.

The following example is given to illustrate the scope of the present invention. Because this example is given for illustrative purposes only, the present invention should not be deemed limited thereto.

EXAMPLE

A semiconductor wafer subjected to reaction ion etching was placed in sample zone 14 of process chamber 12 of the apparatus illustrated in the drawing. The wafer, representative of sample 16 in the drawing, was then contacted with a composition, which was then introduced through conduit 22, which included supercritical carbon dioxide, trichloracetic acid and acetic acid. The specific constituency of the composition was 91.7% supercritical $CO_2$; 0.35% trichloracetic acid; and 8.0% acetic acid, said percentages being by weight, based on the total weight of the composition. The semiconductor wafer was contacted with this composition for a period of 30 minutes. During this time, the process chamber was maintained at a temperature of 40° C. and a pressure of 3,000 psi.

At the conclusion of this period the wafer was completely free of residue resulting from RIE.

The above embodiments and example are given to illustrate the scope and spirit of the present application. These embodiments and example will make apparent, to those skilled in the art, other embodiments and examples. These other embodiments and example are within the contemplation of the present application. Therefore, the present invention should be limited only by the appended claims.

What is claimed is:

1. A composition comprising liquid or supereritical carbon dioxide and an acid selected from the group consisting of trichloroacetic acid, dichloroacetic acid, chloroacetic acid and trichlorosulfonic acid said acid present in a concentration such that said liquid or supercritical carbon dioxide represents at least about 85% by weight, based on the total weight of the composition.

2. A composition in accordance with claim 1 wherein said acid is trichloroacetic acid.

3. A composition in accordance with claim 1 wherein said liquid or supercritical carbon dioxide comprises between about 90% and about 99.9% by weight.

4. A composition in accordance with claim 3 wherein said liquid or supercritical carbon dioxide comprises between about 95% and about 99% by weight.

5. A composition in accordance with claim 1 comprising a co-solvent.

6. A composition in accordance with claim 5 wherein said co-solvent is selected from the group consisting of acetic acid, methanol, isopropanol and butylene carbonate.

7. A composition in accordance with claim 5 wherein said co-solvent is present in a concentration in the range of between about 1% and about 20%, said percentages being by weight, based on the total weight of said composition.

8. A composition in accordance with claim 7 wherein said co-solvent is present in a concentration in the range of between about 1% and 10% by weight.

* * * * *